(12) United States Patent
Yasuda et al.

(10) Patent No.: US 10,687,141 B2
(45) Date of Patent: *Jun. 16, 2020

(54) SPEAKER DRIVING DEVICE

(71) Applicant: TRIGENCE SEMICONDUCTOR, INC., Tokyo (JP)

(72) Inventors: Akira Yasuda, Tokyo (JP); Jun-ichi Okamura, Tokyo (JP); Hiroshi Iwamura, Tokyo (JP)

(73) Assignee: TRIGENCE SEMICONDUCTOR, INC., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/156,653

(22) Filed: Oct. 10, 2018

(65) Prior Publication Data

US 2019/0058946 A1 Feb. 21, 2019

Related U.S. Application Data

(63) Continuation of application No. PCT/JP2017/014686, filed on Apr. 10, 2017.

(30) Foreign Application Priority Data

Apr. 12, 2016 (JP) ................................. 2016-079289
Jun. 15, 2016 (WO) .................. PCT/JP2016/067768

(51) Int. Cl.
*H04R 3/04* (2006.01)
*H03G 5/16* (2006.01)
(Continued)

(52) U.S. Cl.
CPC .............. *H04R 3/04* (2013.01); *G06F 3/162* (2013.01); *G06F 3/165* (2013.01); *H03G 3/3005* (2013.01);
(Continued)

(58) Field of Classification Search
CPC ...... H04R 3/04; H04R 29/001; H04R 1/2819; H03G 5/025; H03G 5/165; H03G 3/3005; G06F 3/165
See application file for complete search history.

(56) References Cited

U.S. PATENT DOCUMENTS 8,306,244 B2 11/2012 Okamura et al.
8,423,165 B2 4/2013 Yasuda et al.
(Continued)

FOREIGN PATENT DOCUMENTS

JP 2010-50875 A 3/2010
JP 4778001 B2 9/2011
(Continued)

OTHER PUBLICATIONS

Karsten Oyen, "Compensation of Loudspeaker Nonlinearities—DSP implementation", Master of Science in Electronics, Norwegian University of Science and Technology Department of Electronics and Telecommunications, Aug. 2007, p. 21-27.
Wolfgang Klippel, "Direct Feedback Linearization of Nonlinear Loudspeaker Systems", JAES vol. 46 Issue 6 pp. 199-507; Jun. 1998.
(Continued)

*Primary Examiner* — Ping Lee
(74) *Attorney, Agent, or Firm* — Hauptman Ham, LLP

(57) ABSTRACT

A speaker driving device including a setting part setting at least one parameter defining an equivalent circuit of a first speaker unit as a first parameter; a first calculator configured to change a first frequency response based on the first parameter, the changed first frequency response being applied to an input signal; and a driving signal generator configured to generate a drive signal for driving a speaker unit based on a first calculation signal, the first calculation signal being obtained by applying the changed first frequency response to the input signal.

8 Claims, 14 Drawing Sheets

(51) Int. Cl.
  *G06F 3/16* (2006.01)
  *H03G 5/02* (2006.01)
  *H03G 3/30* (2006.01)
  *H04R 29/00* (2006.01)
  *H04R 1/28* (2006.01)

(52) U.S. Cl.
  CPC ............ *H03G 5/025* (2013.01); *H03G 5/165* (2013.01); *H04R 29/001* (2013.01); *H04R 1/2819* (2013.01)

(56) References Cited

U.S. PATENT DOCUMENTS

| | | | |
|---|---|---|---|
| 9,219,960 | B2 | 12/2015 | Yasuda et al. |
| 9,300,310 | B2 | 3/2016 | Yasuda et al. |
| 2004/0002781 | A1* | 1/2004 | Johnson .......... H04R 3/04 700/94 |
| 2005/0094830 | A1* | 5/2005 | Stanley .......... H04R 3/14 381/111 |
| 2006/0133620 | A1 | 6/2006 | Lashkari |
| 2010/0092004 | A1 | 4/2010 | Kuze |
| 2012/0275616 | A1 | 11/2012 | Yamamoto et al. |
| 2015/0271615 | A1 | 9/2015 | Kano et al. |

FOREIGN PATENT DOCUMENTS

| | | |
|---|---|---|
| JP | 4805749 B2 | 11/2011 |
| JP | 2012-231391 A | 11/2012 |
| JP | 2014-96657 A | 5/2014 |
| JP | 2015-126460 A | 7/2015 |

OTHER PUBLICATIONS

Giannoulis, Dimitrios, Michael Massberg, and Joshua D. Reiss. "Digital Dynamic Range Compressor Design—A Tutorial and Analysis". Journal of Audio Engineering Society. vol. 60, Issue 6, pp. 399-408. Cited in the specification of the copending application (PCT/JP2017/036544).
International Search Report dated Jun. 27, 2017 for the PCT application No. PCT/JP2017/014686, with English Translation.
Written Opinion of the ISA dated Jun. 27, 2017 for the PCT application No. PCT/JP2017/014686.
International Search Report dated Jun. 27, 2017 for the copending PCT application (No. PCT/JP2017/014687), with English Translation.
Written Opinion of the ISA dated Jun. 27, 2017 for the copending PCT application (No. PCT/JP2017/014687).
International Search Report dated Sep. 6, 2016 for the basic PCT application (No. PCT/JP2016/067768), with English Translation.
Written Opinion of the ISA dated Sep. 6, 2016 for the basic PCT application (No. PCT/JP2016/067768).
English translation of Written Opinion of the ISA dated Jun. 27, 2017 for the PCT application No. PCT/JP2017/014686.
English translation of Written Opinion of the ISA dated Jun. 27, 2017 for the copending PCT application No. PCT/JP2017/014687.
English translation of Written Opinion of the ISA dated Sep. 6, 2016 for the basic PCT application No. PCT/JP2016/067768.
Office Action dated May 14, 2019 for the Copending U.S. Appl. No. 16/156,706.
U.S. Office Action dated Feb. 5, 2019 for the Copending US. Appl. No. 16/156,706.

* cited by examiner

| Template | Parameter | | |
|---|---|---|---|
| | A | B | ... |
| AAA | a1 | b1 | ... |
| BBB | a2 | b2 | ... |
| CCC | a3 | b3 | ... |
| ⋮ | ⋮ | ⋮ | ⋱ |

Re: electrical voice coil resistance at DC
Le: frequency independent part of voice coil inductance
Mms: mechanical mass of driver diaphragm assembly including air load and voice coil
Rms: mechanical resistance of total-driver losses
Kms: mechanical stiffness of driver suspension
Bl: force factor (Bl product)
u: voltage source
v: voice-coil velocity

FIG.11
Frequency Response
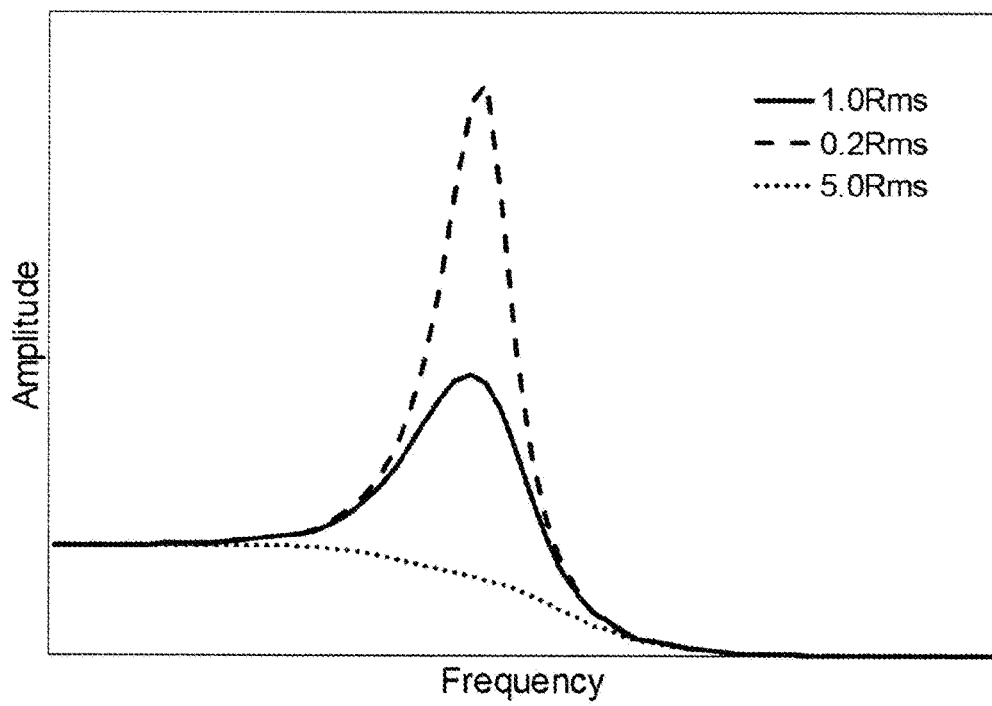
Step Response
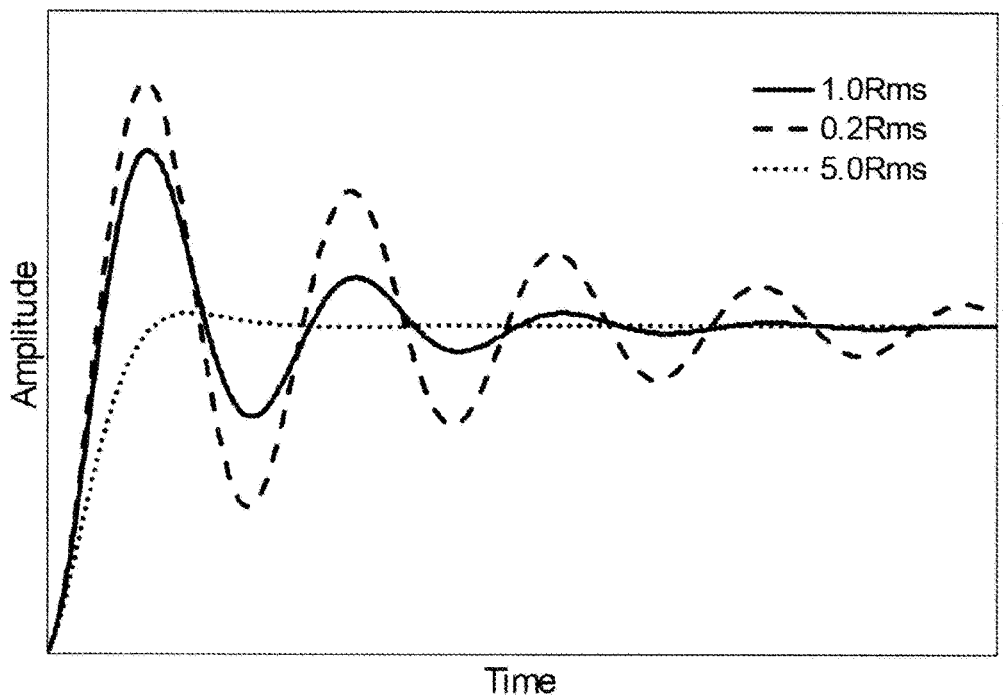

FIG. 12
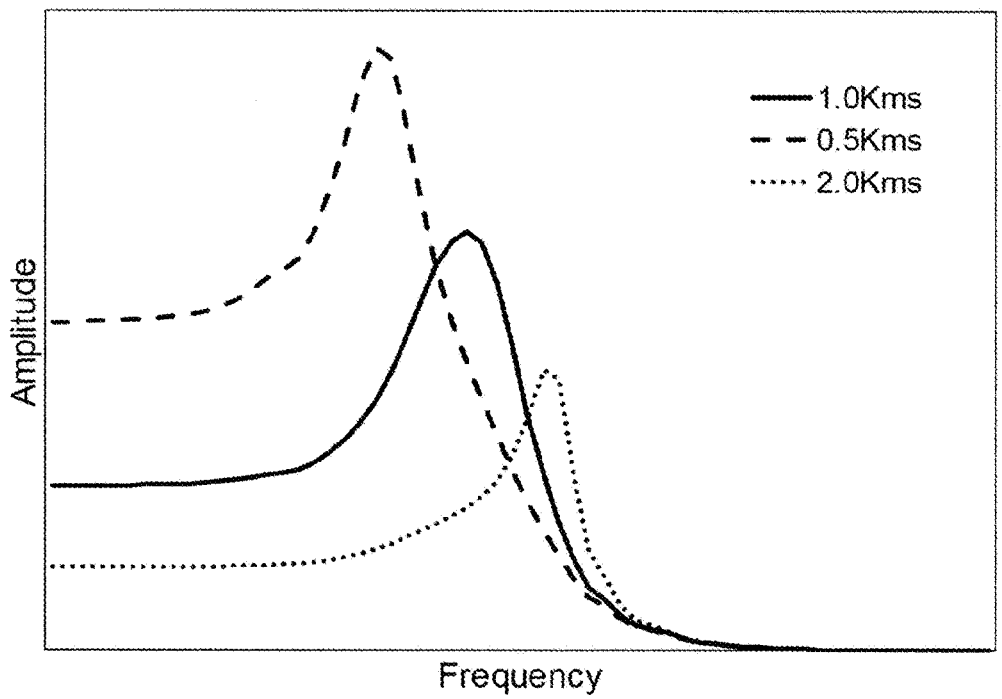
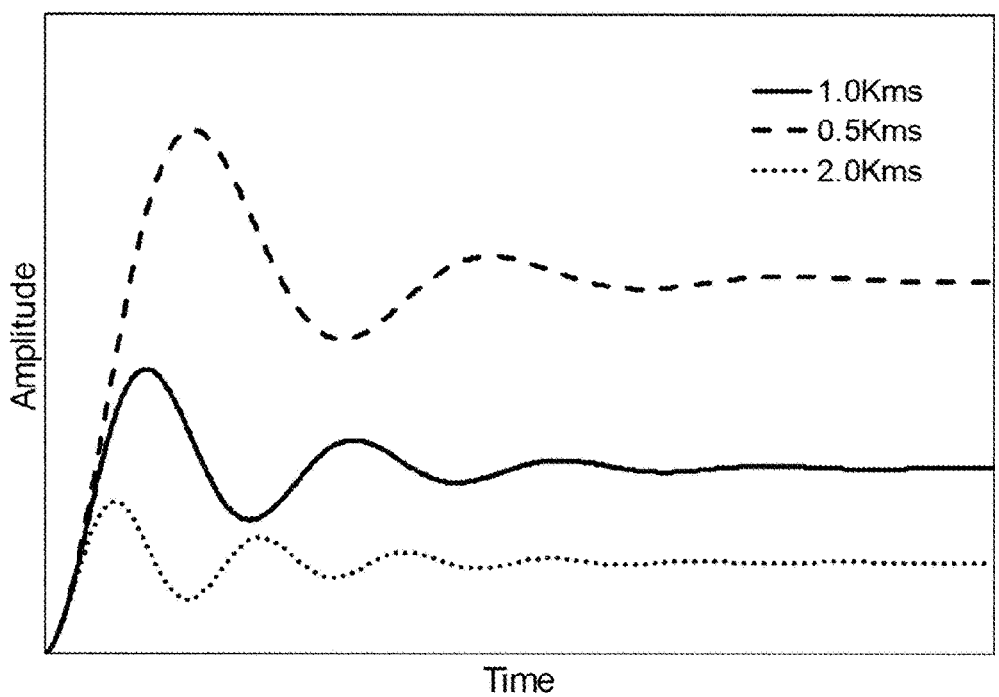

FIG. 13
Frequency Response
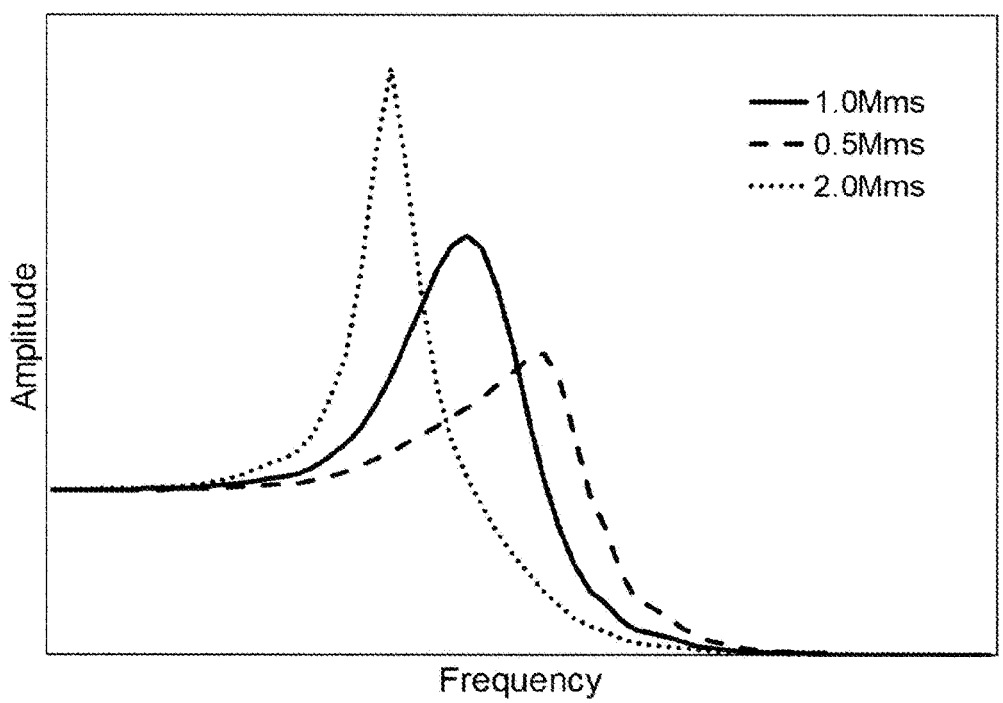
Step Response
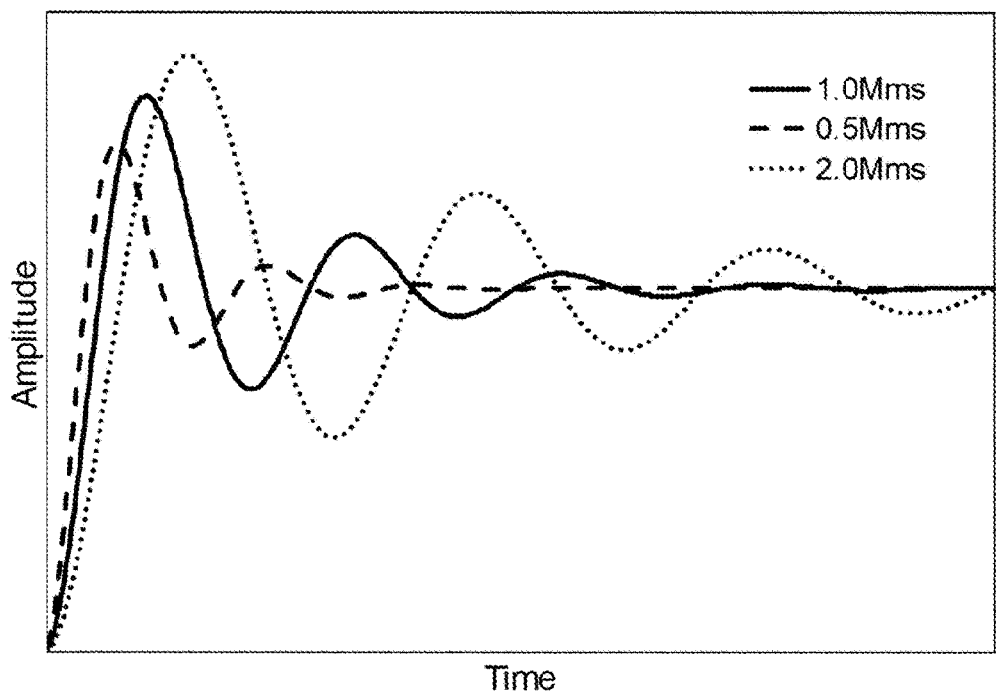

FIG. 14

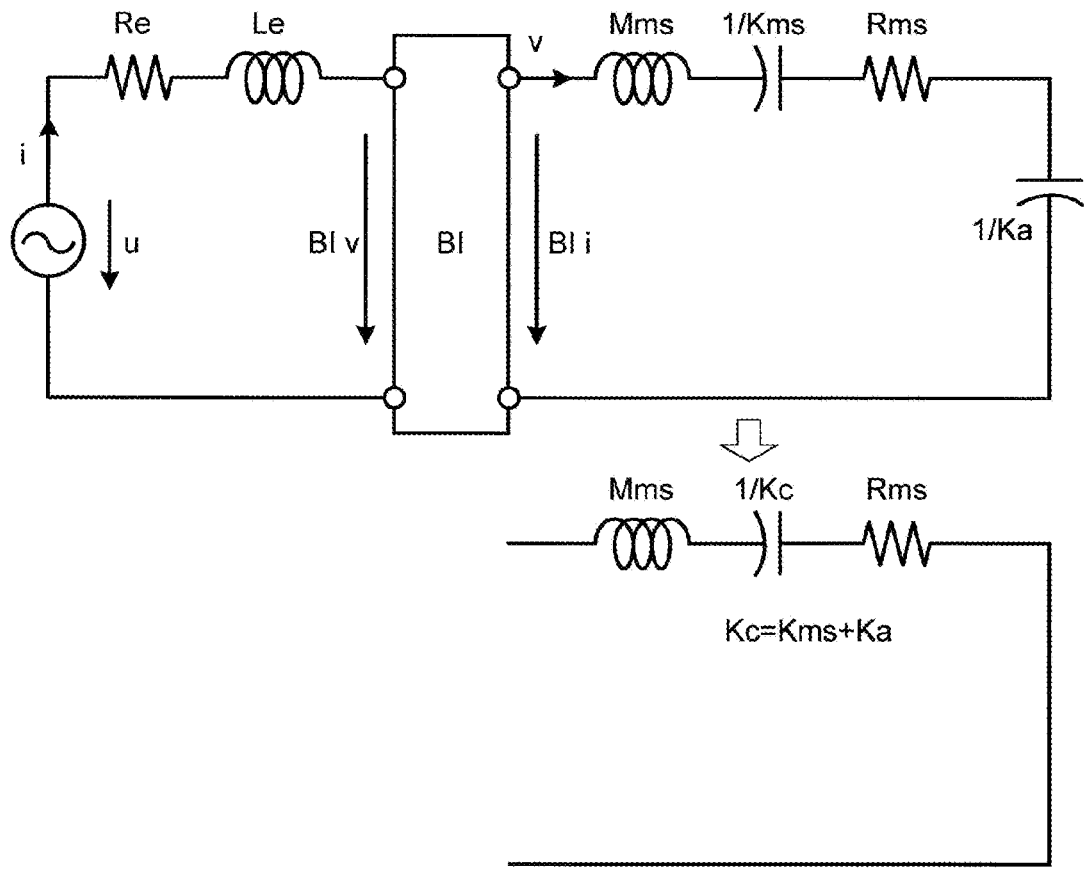

$Ka = \rho Vs^2 Sd^2/Cb$
$Vas = \rho Vs^2 Sd^2/Kms$
$Ka = VasKms/Cb$
$Kc = Kms+Ka = Kms(1+Vas/Cb)$
$\quad = Kms(1+\rho Vs^2 Sd^2/KmsCb)$ $\rho = 1.293 - 0.0047T$
$Vs = 331.5 + 0.61T$ Ka: acoustic stiffness of air in enclosure
Sd: effective surface area of driver diaphragm
Vas: equivalent air volume of suspension
Cb: volume of enclosure
$\rho$: density of air
Vs: speed of sound
T: Temperature(°C)
Kc: total system stiffness

- $M_P$: acoustic mass of air in the port
- $C_B$: acoustic compliance of air in enclosure
- $R_P$: acoustic resistance of port losses
- $S_D$: diaphragm area
- $p_A$: sound pressure
- $q_P$: volume velocity

SPEAKER DRIVING DEVICE

CROSS REFERENCE TO RELATED APPLICATIONS

This application is a U.S. continuation application filed under 35 U.S.C. § 111(a), of International Application No. PCT/JP2017/014686, filed on Apr. 10, 2017, which claims priority to Japanese Patent Application No. 2016-079289, filed on Apr. 12, 2016 and International Application No. PCT/JP2016/067768, filed on Jun. 15, 2016, the disclosures of which are incorporated herein by reference.

FIELD

The present invention is related to a technology for driving a speaker.

BACKGROUND

There are various techniques for adding acoustic effects to a sound which is output from a speaker. For example, a frequency response is applied to an input audio signal as an acoustic effect. When an audio signal to which a frequency response is applied is supplied to a speaker, the sound to which the frequency response is applied is output from the speaker. As a result, by changing the frequency response which is applied, it is possible to variously change the characteristics of the sound. An equalizer device for providing such acoustic effects is disclosed in, for example, Japanese Laid Open Patent Publication No. 2010-50875.

SUMMARY

According to one embodiment of the present invention, a speaker driving device is provided including a setting part setting at least one parameter defining an equivalent circuit of a first speaker unit as a first parameter; a first calculator configured to change a first frequency response based on the first parameter, the changed first frequency response being applied to an input signal; and a driving signal generator configured to generate a drive signal for driving a speaker unit based on a first calculation signal, the first calculation signal being obtained by applying the changed first frequency response to the input signal.

According to one embodiment of the present invention, a speaker driving device is provided including a first calculator calculating information related to a position of a diaphragm of a first speaker unit corresponding to a specified first parameter by a calculation using an input signal and outputting a first calculation signal corresponding to the calculated information; and a drive signal generator generating a drive signal for driving a speaker unit based on the first calculation signal; wherein the drive signal generator includes a second calculator, the second calculator calculates information related to a position of a diaphragm of a second speaker unit corresponding to a specified second parameter by a calculation using the drive signal and outputting a second calculation signal corresponding to the calculated information; and the drive signal generator generates the drive signal based on the first calculation signal and the second calculation signal.

According to one embodiment of the present invention, a speaker driving device is provided including a drive signal generator generating a drive signal for driving a speaker unit based on an input signal; wherein the drive signal generator includes a second calculator, the second calculator changes a second frequency response of the drive signal based on a second parameter corresponding to a second speaker unit, and the drive signal is generated based on the input signal and a drive signal with the second frequency response changed by the second calculator.

BRIEF DESCRIPTION OF DRAWINGS

FIG. 11 is a diagram showing a change in a frequency response and a step response in the case when Rms (mechanical resistance) is changed;

FIG. 12 is a diagram showing a change in a frequency response and a step response in the case when Kms (stiffness) is changed;

FIG. 13 is a diagram showing a change in a frequency response and a step response in the case when Mms (mass) is changed;

FIG. 14 is a diagram for explaining a specific example of a parameter which stipulates an equivalent circuit of a speaker unit arranged in a closed type enclosure (Closed Box)

DESCRIPTION OF EMBODIMENTS

A speaker device in one embodiment of the present invention is explained in detail below while referring to the diagrams. The plurality of embodiments shown below are merely example embodiments of the present invention and the present invention should not be interpreted as being limited to these embodiments. That is, it is possible to perform the invention in various modes by modifying and applying the known technology to the plurality of embodiments explained herein. Furthermore, in the diagrams referred to in the present embodiment, the same or similar reference symbols (only reference symbols attached with A, B and the like after a number) are attached to the same parts or parts having similar functions, and therefore a repeated explanation may be omitted.

First Embodiment

Figure 1:
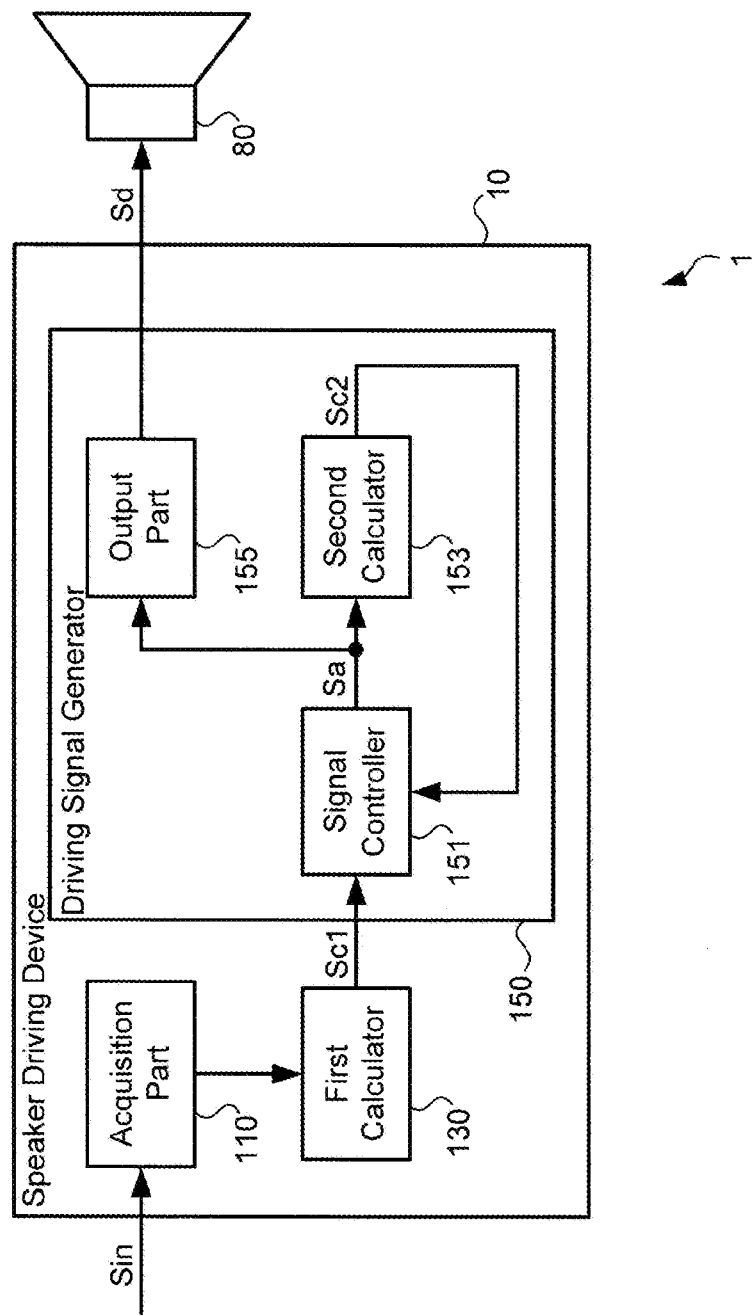
FIG. 1 is a block diagram showing a function of a speaker device in a first embodiment.

FIG. 1 is a block diagram showing a function of a speaker device in the first embodiment. The speaker device 1 is arranged with a speaker driving device 10 and a speaker unit 80. The speaker driving device 10 is input with an audio signal Sin, converts the signal into a drive signal Sd for driving the speaker unit 80, and outputs the drive signal Sd. The speaker unit 80 outputs a sound corresponding to the drive signal Sd which is supplied from the speaker driving device 10. In the speaker device 1, although it is possible to output sounds corresponding to the characteristics of the speaker unit 80, it is also possible to output sounds which are reproduced imitating a speaker unit (sometimes referred to as a target speaker unit herein) which has characteristics different from the characteristics of the speaker unit 80. The structure of the speaker device 1, in particular, the structure of the speaker driving device 10 is explained in detail below.

According to the technique disclosed in Japanese Laid Open Patent Application Publication No. 2010-50875, an acoustic effect is applied by convolving an impulse response. When a technique which convolves this type of impulse response is used, it is possible to change the characteristics of the sound output from a speaker in various ways. On the other hand, even when such a technique is used, it is often the case that it is not possible to realize the desired sound characteristics. For example, in the case where a sound output from a speaker is brought artificially close to a sound which is output using a different speaker, it was difficult to obtain a sufficient effect just by adjusting the frequency response to be applied to the audio signal. As described above, according to the speaker device related to the first embodiment, it is possible to generate a drive signal for bringing the sound output from a certain speaker closer to a sound output from another speaker.

As is shown in FIG. 1, the speaker driving device 10 is arranged with an acquisition part 110, a first calculator 130 and a driving signal generator 150. In this example, the driving signal generator 150 includes a signal controller 151, a second calculator 153 and an output part 155. The acquisition part 110 acquires an audio signal Sin supplied from the exterior of the speaker driving device 10 as an input signal. In this example, the acquisition part 110 is a terminal which is connected to a device which supplies the audio signal Sin. Furthermore, the acquisition part 110 may acquire the audio signal Sin from an external device such as a server via a network.

The first calculator 130 performs a calculation according to an electromechanical model of a speaker unit using the audio signal Sin acquired by the acquisition part 110, and outputs a first calculation signal Sc1 which indicates a calculation result. This speaker unit is not the speaker unit 80 described above but a target speaker unit (first speaker unit). The calculation performed by the first calculator 130 is a calculation of an operation (internal state) of the target speaker unit which uses the audio signal Sin as an input signal, using a parameter which specifies the structure of the target speaker unit. In this example, the operation of the target speaker unit is a time change of the position of a diaphragm. As a result, in this example, the first calculation signal Sc1 corresponds to the position of the diaphragm of the target speaker unit. In this way, a frequency response corresponding to the target speaker unit is provided to the audio signal Sin. Furthermore, this parameter does not need not be a value which directly specifies a structure but may be a parameter which indicates a characteristic acquired according to the structure of the speaker unit. A parameter used in the first calculator 130, that is, a parameter which the structure of the target speaker unit is referred to as a first parameter herein.

For example, the first parameter is at least one parameter which stipulates an equivalent circuit of the target speaker unit (or each structure which forms the target speaker unit), for example, a mass, a spring constant of a damper, a magnetic flux density, an inductance, a stiffness or a mechanical constant such as mechanical resistance. Examples of parameters that stipulate an equivalent circuit of a speaker unit are described later. The first parameter may be a damping factor or a resonance frequency and the like which can be calculated by combining these parameters. Furthermore, the first parameter may also be a characteristic in a time domain or a value for controlling this. In addition, the first parameter may be a value for calculating the position (or velocity) of the diaphragm of the target speaker unit, the maximum value of the position of the diaphragm, the impulse response characteristic of the diaphragm, the step response characteristic of the diaphragm, the impulse response characteristic of the position of the diaphragm, the step response characteristic of the position of the diaphragm or may be each characteristic of reproduced sound pressure and not each characteristic related to the diaphragm. In whichever case, it is not simply a parameter on the frequency domain (center frequency•Q•cutoff•gain) but may be a parameter which affects the position of the diaphragm of the target speaker unit by a calculation.

Although the first calculation signal Sc1 corresponds to a position of the diaphragm of the target speaker unit, it is sufficient that it be a value corresponding to information related to this position. For example, the information related to the position may be, for example, the speed or current and the like of the diaphragm. Although an electromechanical model of the target speaker unit is used in the calculation in the first calculator 130, an acoustic (radiation characteristic) model or a spatial propagation model may also be used. In this case, the first calculation signal Sc1 does not indicate the position of the diaphragm of the target speaker unit but may indicate vibration of the air at a certain position. Even in this case, it can be said to be a calculation result related to the position of a diaphragm. The model which is used for the calculation may also include not only linear characteristics but also a calculation related to non-linear characteristics.

Any method can be applied as long as it is a well-known calculation method as specific content of the model which is used for the calculation described above. Known calculation methods are exemplified in the following documents. Karsten Oyen, "Compensation of Loudspeaker Nonlinearities—DSP implementation", [online], Master of Science in Electronics, Norwegian University of Science and Technology Department of Electronics and Telecommunications, August 2007, p.21-27, [Apr. 11, 2016 search], Internet <URL: http://www.diva-portal.org/smash/get/diva2: 347578/FULLTEXT01.pdf>

Next, a signal controller 51, a second calculator 153 and the output part 155 which are included in the driving signal generator 150 are explained. The signal controller 151 receives the first calculation signal Sc1 and a second calculation signal Sc2 and outputs a drive signal Sa to the second calculator 153 and the output part 155. The drive signal Sa is generated and output so that the first calculation signal Sc1 and the second calculation signal Sc2 match. The second calculation signal Sc2 is a signal generated by the second calculator 153 based on the drive signal Sa. The second calculation signal Sc2 is described later.

The output part 155 outputs the acquired drive signal Sa to the speaker unit 80 as a drive signal Sd. In this example, the output part 155 is a terminal which is connected to the speaker unit 80. In addition, the drive signal Sa and the drive signal Sd are the same signal. Furthermore, the output part 155 may transmit the drive signal Sd to an external device via a network. In addition, the drive signal Sa and the drive signal Sd do not have to be the same signal. For example, the output part 155 may adjust the dynamic range of the drive signal Sa and output it as the drive signal Sd. In addition, the drive signal Sd may be a signal which is acquired by amplifying the drive signal Sa. Depending on the content of the calculation, there are cases where the output level of the drive signal Sa acquired as described above becomes larger compared to the output level of the audio signal Sin. In such a case, the drive signal Sd may be a signal which is acquired by compressing the dynamic range of the drive signal Sa.

The second calculator 153 calculates the electromechanical model of a speaker unit using the drive signal Sa output from the signal controller 151 as an input signal and outputs a second calculation signal Sc2 which indicates the calculation result. This speaker unit is referred to as a driving speaker unit (second speaker unit) below. The calculation performed by the second calculator 153 is a calculation of the operation of the driving speaker unit using the drive signal Sa as an input signal by using a parameter which specifies the structure of the driving speaker unit. In this example, the operation of the driving speaker unit is a time change of the position of the diaphragm. As a result, in this example, the second calculation signal Sc2 corresponds to the position of the diaphragm of the driving speaker unit. In this way, a frequency response which corresponds to the driving speaker unit is provided to the driving signal Sa. Basically, the first calculation signal Sc1 and the second calculation signal Sc2 show a time change of the same physical quantity. Furthermore, similar to the case of the first calculator 130, this parameter does not need to be a value which directly specifies a structure but may be a parameter which indicates a characteristic acquired according to the structure of the speaker unit. A parameter which is used in the second calculator 153, that is, a parameter which specifies the structure of the driving speaker unit is referred to as a second parameter herein.

The driving speaker unit is assumed to be the speaker unit 80 described above. Therefore, the second parameter is a value related to the speaker unit 80. As is described later, by making this kind of setting, the sound output from the speaker unit 80 can be brought closer to the sound of the target speaker unit. Furthermore, although the sound of the target speaker unit changes, the second parameter may be set with the driving speaker unit as a speaker unit other than the speaker unit 80 while aiming to provide various sound effects which are unintended.

Since the second parameter is exemplified by the same contents as the first parameter described above, an explanation is omitted. In addition, with respect to the calculation in the second calculator 153, a model similar to the first calculator 130 may be used. That is, the same model is used in the calculation process in the first calculator 130 and the calculation process in the second calculator 153. Furthermore, although it is not necessary to use the same model for these calculation processes, also in this case, in order to make a comparison in the signal controller 151 easier, the second calculation signal Sc2 is preferred to be a signal which indicates a time change in the same physical quantity as the first calculation signal Sc1. That is, similar to the first calculation signal Sc1, the second calculation signal Sc2 is not limited to the position of the diaphragm and may be a value corresponding to information related to the position of the diaphragm.

The signal controller 151 outputs the drive signal Sa so that the first calculation signal Sc1 and the second calculation signal Sc2 match. In order to generate the drive signal Sa, a general feedback control (PID control, optimum control, application control and the like) may be used or the same technique as the control of a digital power supply may be used. The feedback gain which is set at the time of feedback control may be updated according to the value of the second parameter when the second parameter which is set in the second calculator 153 changes. At this time, a value which is determined in advance according to the second parameter to be set may be set as the feedback gain, or a value acquired by a structure which automatically calculates an appropriate value according to the set second parameter to be set may be set. In this way, the drive signal Sa is output so that the second calculation signal Sc2 which corresponds to the driving speaker unit matches the first calculation signal Sc1 which corresponds to the target speaker unit.

When this drive signal Sa is supplied to an actual driving speaker unit, it is possible to drive the driving speaker unit using the same operation as when driving the target speaker unit by the audio signal Sin. As a result, in the case where the driving speaker unit is specified using the second parameter of the speaker unit 80, the sound in the case when the audio signal Sin is output using the target speaker unit is reproduced in the sound output from speaker unit 80.

Furthermore, as described above, in the case when the driving speaker unit is specified by the second parameter which corresponds to a structure other than the speaker unit 80, it is also possible to output a sound from the speaker unit 80 which is further applied with sound effects (effect corresponding to the second parameter) in addition to the sound in the case when the audio signal Sin is output using the target speaker unit.

Second Embodiment

In the second embodiment, a speaker device 1A is explained in which the settings of a first parameter and a second parameter can be changed. Furthermore, here, an example is explained in which both the first parameter and the second parameter can be set. However, a structure may be adopted in which one of the two parameters can not be changed from a value set in advance.

Figure 2:
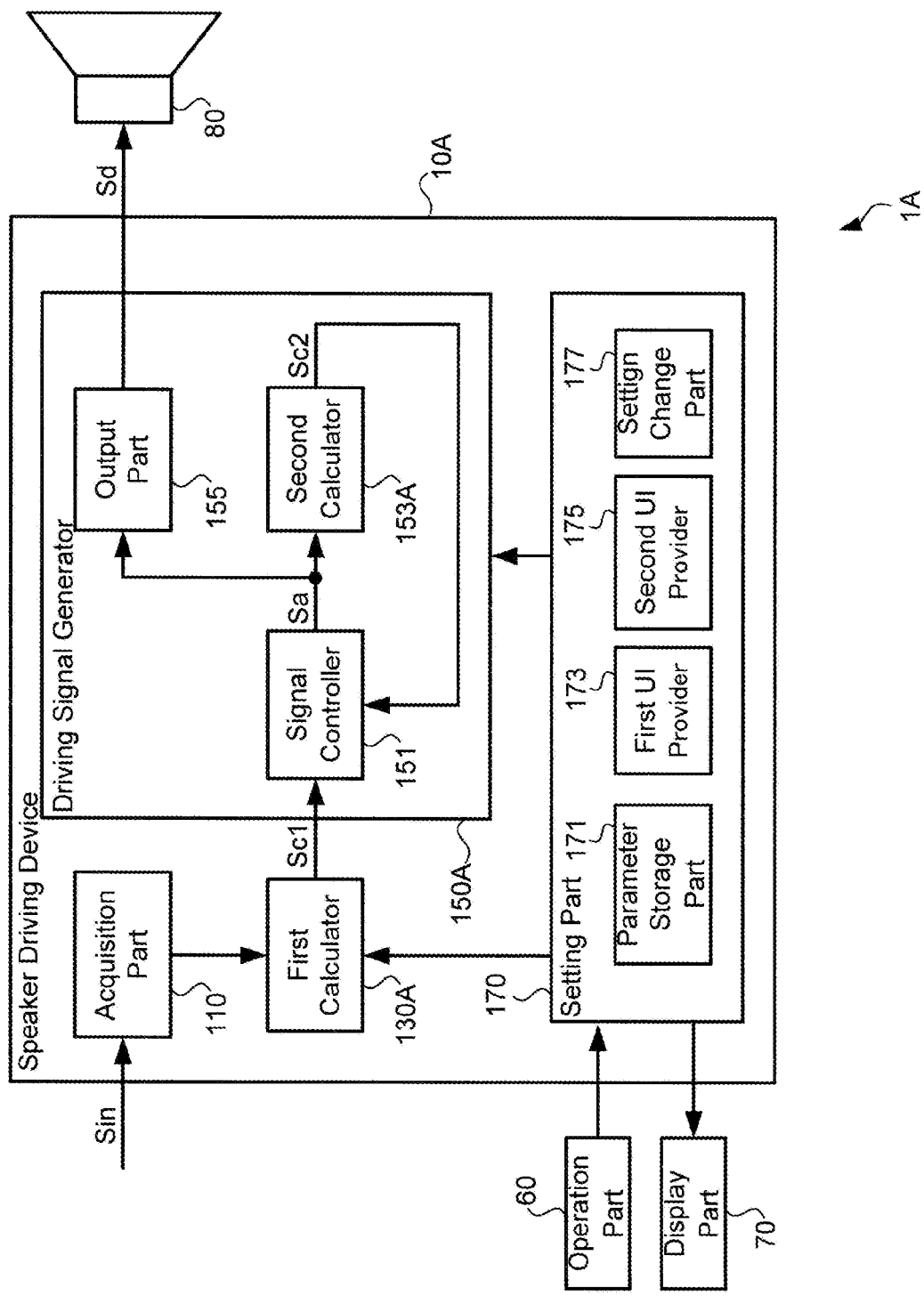
FIG. 2 is a block diagram showing a function of a speaker device in a second embodiment.

FIG. 2 is a block diagram showing a function of a speaker device in the second embodiment. The speaker device 1A shown in FIG. 2 is arranged with a speaker driving device 10, an operation part 60, a display part 70 and a speaker unit 80. The operation part 60 is a device which accepts an input operation from a user such as a touch sensor, a keyboard or a mouse and outputs an operation signal corresponding to the input operation to the speaker drive unit 10. The display part 70 is a display device such as a liquid crystal display or an organic EL display and a screen is displayed based on the control of the speaker driving device 10. Furthermore, the operation part 60 and the display part 70 may be integrated to form a touch panel.

The speaker driving device 10A is arranged with an acquisition part 110, a first calculator 130A, a driving signal generator 150A and a setting part 170. Since the acquisition part 110 has a similar structure to that of the first embodiment, an explanation is omitted. In this example, the first parameter which is set in the first calculator 130A can be changed and set by the setting part 170. In addition, the second parameter which is set in the second calculator 153A in the driving signal generator 150A can also be changed and set by the setting part 170. Apart from being able to change and set the value of a parameter, the first calculator 130A and the second calculator 153A are the same as in the first embodiment and therefore a detailed explanation is omitted.

The setting part 170 is arranged with a parameter storage part 171, a first UI provider 173, a second UI provider 175 and a setting change part 177. The parameter storage part 171 is stored with a template table.

Figures 3, 4:
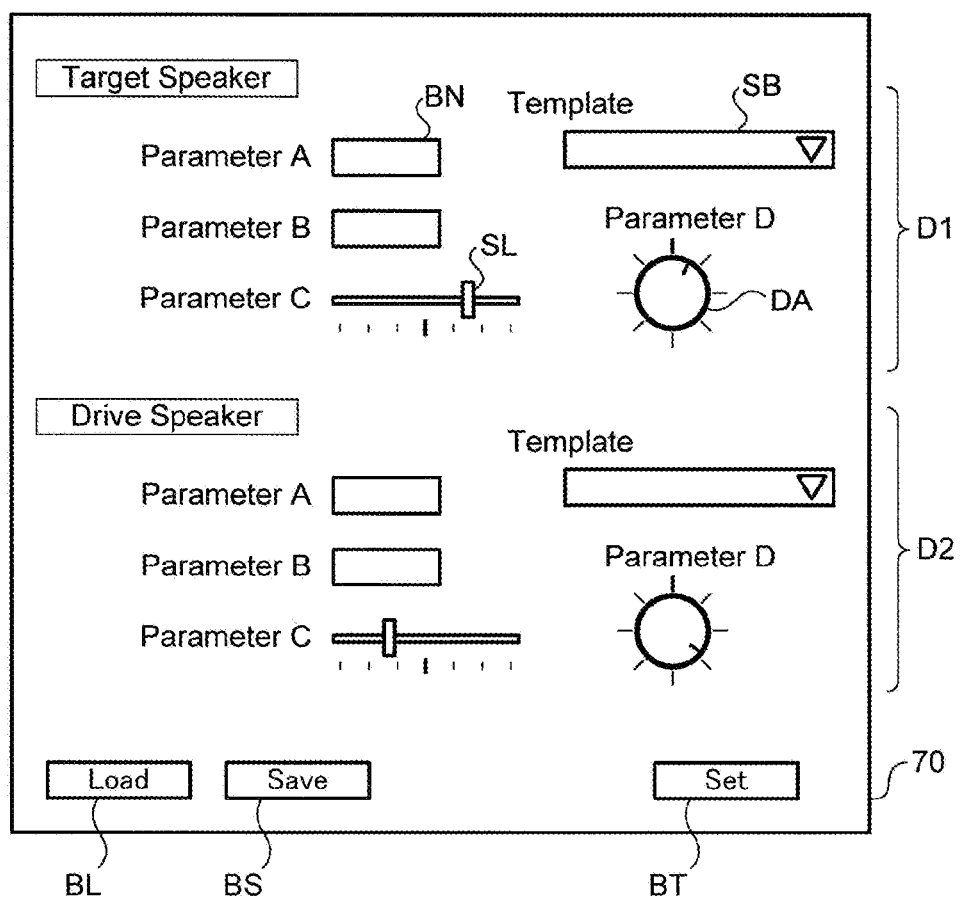
FIG. 3 is a diagram for explaining a template table in the second embodiment.
FIG. 4 is a diagram for explaining a user interface in the second embodiment.

FIG. 3 is a diagram for explaining the template table in the second embodiment. The template table stipulates a combination of first parameters used in the first calculator 130A and a combination of second parameters used in the second calculator 153A. In the example shown in FIG. 3, the template "AAA" stipulates the combination "a1" for parameter A, "b1" for parameter B, • and so on. For example, "AAA" is information which corresponds to the model number of the speaker unit. In addition, the combination of the parameters stipulated by the template "AAA" is the value of each parameter corresponding to the speaker unit with that model number. In this example, the parameters A, B, ... become a first parameter in the case of being set as a parameter of the target speaker unit in the first calculator 130A and become a second parameter in the case of being set as a parameter of the driving speaker unit in the second calculator 153A.

Returning to FIG. 2, the first UI provider 173 provides a user interface for specifying the first parameter set in the first calculator 130A. The second UI provider 175 provides a user interface for specifying the second parameter set in the second calculator 153A. These user interfaces are realized by being displayed on the display part 70 and accepting an input operation from the operation part 60.

FIG. 4 is a diagram for explaining a user interface in the second embodiment. As is shown in FIG. 4, a first user interface D1 which is provided by the first UI provider 173 and a second user interface D2 which is provided by the second UI provider 175 are displayed in the display part 70. The first user interface D1 is a region for specifying the parameters (first parameter) related to the target speaker unit. The second user interface D2 is a region for specifying the parameters (second parameter) related to the driving speaker unit. For example, these parameters are specified by inputting a numerical value using an input box BN, a slider SL or a dial DA. In addition, a selection box SB is an interface which can select a template stipulated by the template table. When a template is selected using the selection box SB, parameters corresponding to this template are read out from the template table and are automatically input. It is also possible to modify the value which is read out. A recommended value which is determined in advance may also be input in advance before the parameters corresponding to a template are read out.

Furthermore, information which assumes deterioration of a speaker unit can be input in the user interface. For example, the set parameters may be corrected and a calculation process may be amended by entering the period of use of a speaker unit (for example, yearly unit). For example, a calculation process may be amended so that the phenomenon whereby a damper becomes harder as the period of use becomes longer is reproduced. An interface which can input amendment information for changing parameters such as air pressure and humidity in addition to the period of use and amending a calculation process may also be provided.

A save button BS is an interface for storing in a memory a value input corresponding to each parameter as a combination of parameters the same as the template. A load button BL reads out the parameters stored in the memory and inputs them corresponding to parameters of the first user interface D1 and the second user interface D2.

When a set button BT is operated, the setting change part 177 sets the first parameter in the first calculator 130A based on a value input in the first user interface D1 and sets the second parameter in the second calculator 153A based on a value input in the second user interface D2.

By variously changing the parameters which are set in the first calculator 130A and the second calculator 153A using the user interface shown in FIG. 4, it is possible to variously change the characteristics of a sound output from the speaker unit 80. For example, it is possible to change the target speaker unit by changing the value of the parameter set in the first calculator 130A. In addition, in the case when the speaker unit 80 is connected to another speaker unit X, it is possible to change the parameter set in the second calculator 153A to a parameter which corresponds to the speaker unit X.

Third Embodiment

In the third embodiment, a speaker device 1B which measures the operation of the speaker unit 80 and generates the second calculation signal Sc2 is explained.

Figure 5:
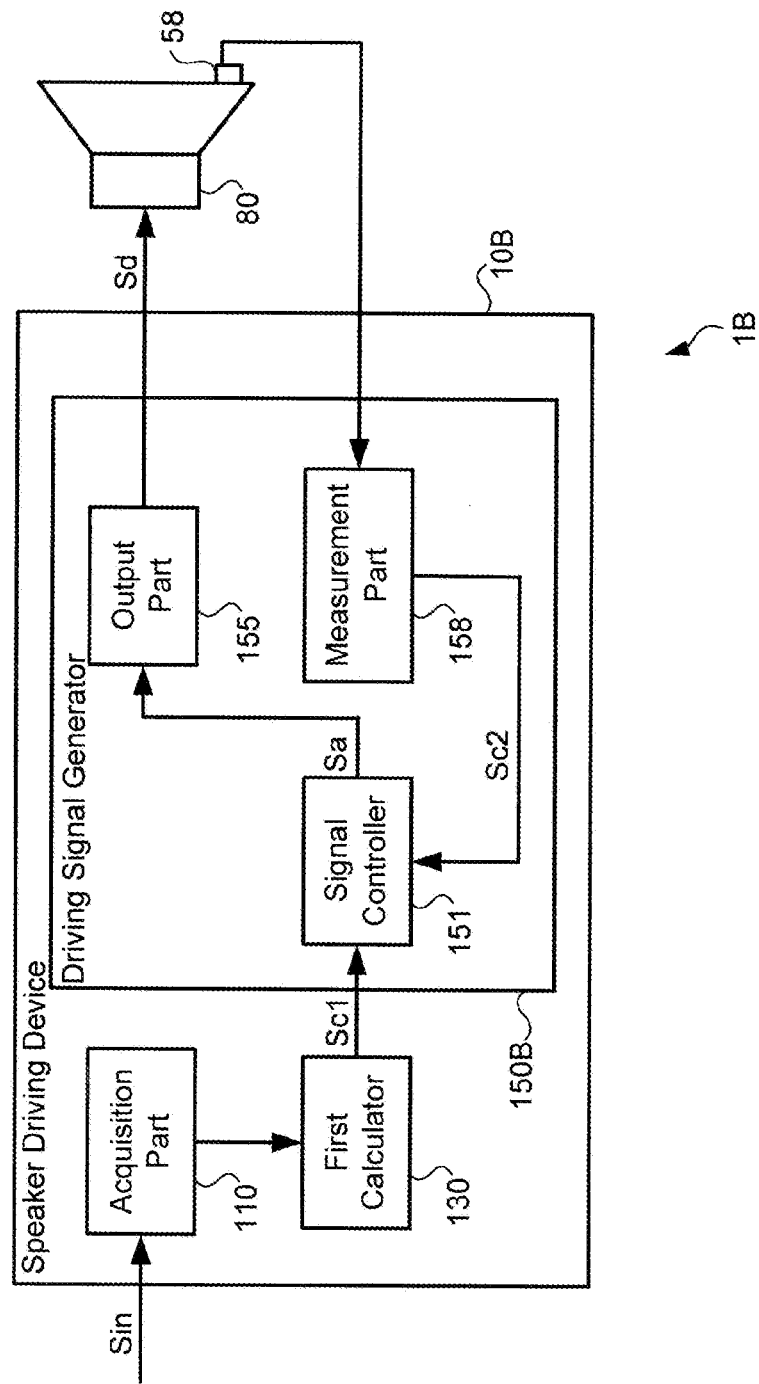
FIG. 5 is a block diagram showing a function of a speaker device in a third embodiment.

FIG. 5 is a block diagram showing a function of a speaker device in the third embodiment. The speaker device 1B is arranged with a speaker driving device 10B, a speaker unit 80 and a sensor 58. The sensor 58 is a detector which detects information related to the position of a diaphragm of the speaker unit 80 and outputs a detection signal corresponding to the detected information. Although in this example the information related to the position of the diaphragm is the position of the diaphragm, the information may also be the speed of the diaphragm or the acceleration of the diaphragm. The speaker driving device 10B is arranged with an acquisition part 110, a first calculator 130 and a driving signal generator 150B. Since the acquisition part 110 and the first calculator 130 have the same structure as in the first embodiment, an explanation is omitted.

The driving signal generator 150B is arranged with a signal controller 151, an output part 155 and a measurement part 158. Since the signal controller 151 and the output part 155 have the same structure as in the first embodiment, an explanation is omitted. The measurement part 158 measures the position of the diaphragm of the speaker unit 80 based on a detection signal from the sensor 58.

The measurement part 158 generates a second calculation signal Sc2 which corresponds to the measured position of the diaphragm and outputs the signal to the signal controller 151. The signal controller 151 outputs the drive signal Sa so that the first calculation signal Sc1 and the second calculation signal Sc2 match.

Although the position of a diaphragm of a driving speaker unit was acquired by a calculation process using a second parameter in the first embodiment, in the third embodiment it is acquired by measuring the position of the diaphragm of the speaker unit 80. By using this method, a sound in the case when the audio signal Sin is output using the target speaker unit is also reproduced in the sound output from the speaker unit 80.

Fourth Embodiment

In the fourth embodiment, a speaker device 10 which automatically changes the second parameter set in the second calculator 153 according to the connected speaker unit 80 is explained.

Figure 6:
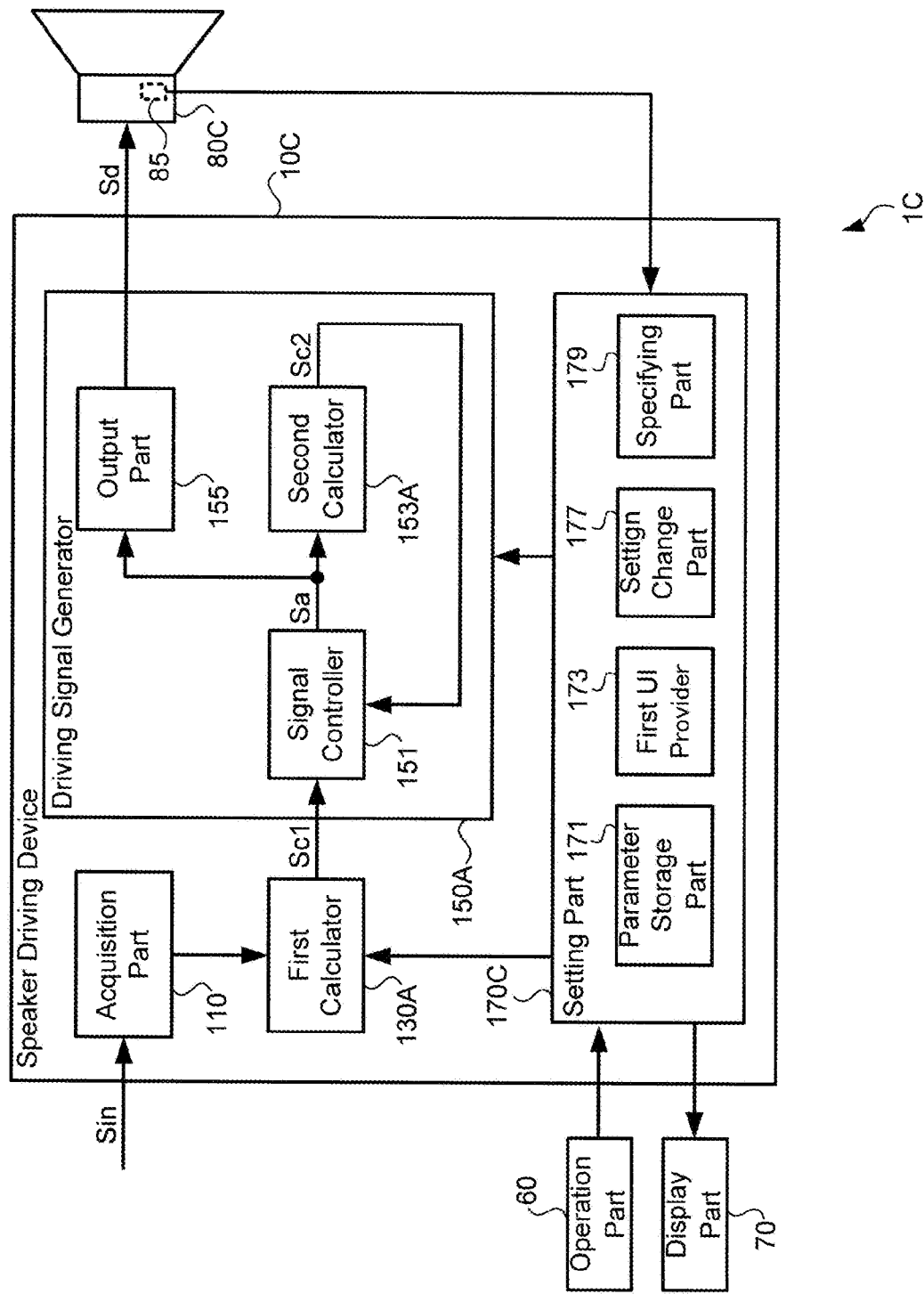
FIG. 6 is a block diagram showing a function of a speaker device in a fourth embodiment.

FIG. 6 is a block diagram showing a function of a speaker device in the fourth embodiment. The speaker device 10 is arranged with a speaker driving device 100, an operator 60, a display part 70 and a speaker unit 80C. The speaker unit 80C is arranged with a memory 85 which stores, for example, identification information for identifying a model number or the like as information related to the speaker unit 80C. The speaker driving device 100 is arranged with an acquisition part 110, a first calculator 130A, a driving signal generator 150A and a setting part 170C. Since the acquisition part 110, the first calculator 130A and the driving signal generator 150A have the same structure as explained in the second embodiment, an explanation is omitted.

The setting part 170C is arranged with a parameter storage part 171, a first UI provider 173, a setting change part 177, and a specifying part 179. Since the parameter storage part 171, the first UI provider 173 and the setting change part 177 have the same structure as explained in the second embodiment, an explanation is omitted. The specifying part 179 acquires identification information from the memory 85 of the connected speaker unit 80C and specifies a value of the second parameter based on the identification information. The specifying part 179 may acquire the identification information by a fixed line connection such as a cable or by radio communication, or by photographing an image such as a two-dimensional code and the like. In addition, the identification information may be information which indicates the value of the second parameter.

When the specifying part unit 179 specifies the value of the second parameter, the setting change part 177 changes the second parameter in the second calculator 153A to the value specified by the specifying part 179. In this way, it is possible to set the second parameter to the second calculator 153A even without a user individually inputting the value of the parameter.

Fifth Embodiment

In the fifth embodiment, a speaker device 1D in which the drive signal Sa can be recorded in a storage device is explained.

Figure 7:
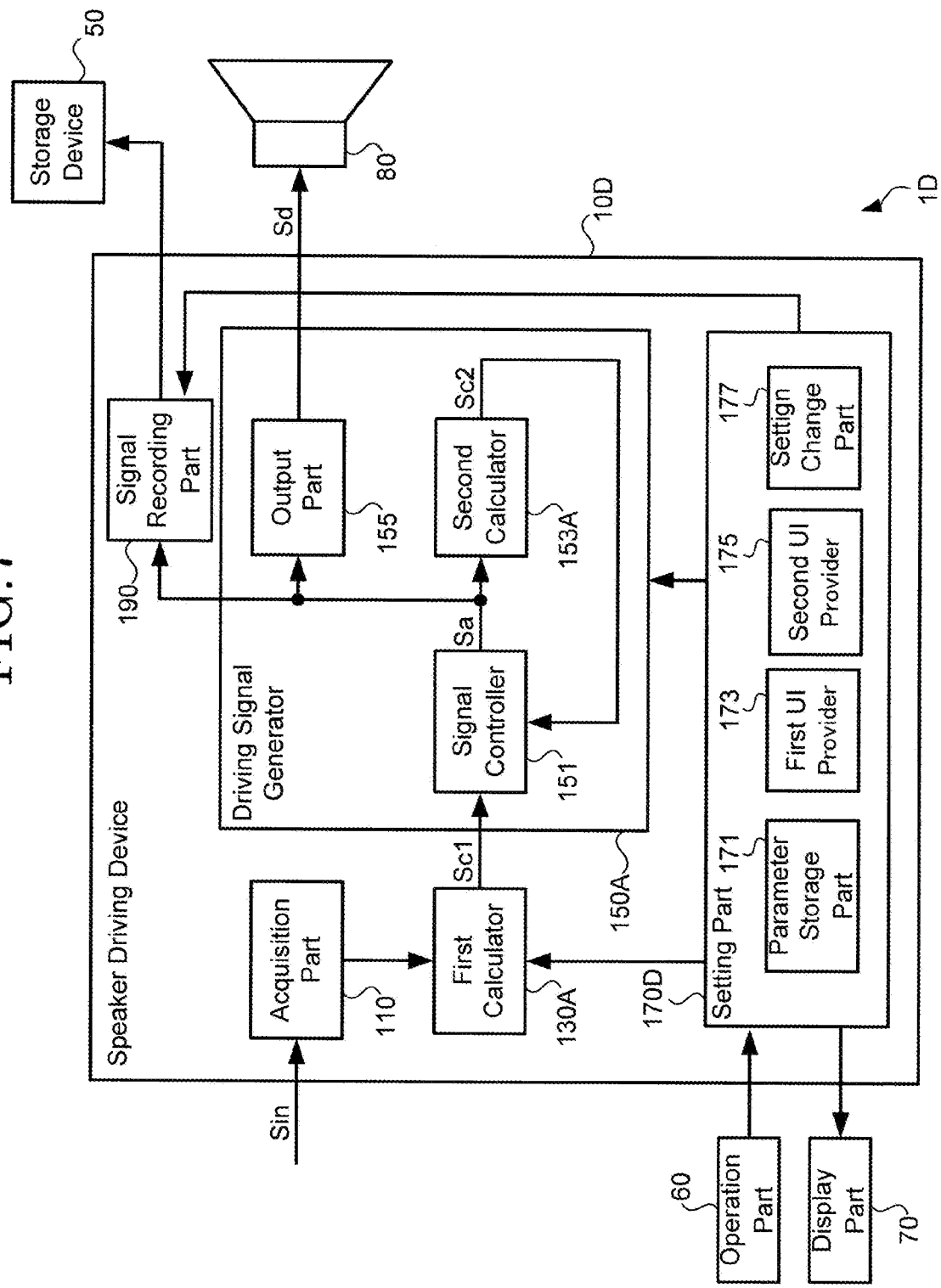
FIG. 7 is a block diagram showing a function of a speaker device in a fifth embodiment.

FIG. 7 is a block diagram showing a function of a speaker device in the fifth embodiment. The speaker device 1D is arranged with a speaker driving device 10D, an operation part 60, a display part 70 and a speaker unit 80. In addition, a storage device 50 can be connected to the speaker driving device 10D. The storage device 50 is a nonvolatile memory such as a USB memory or a memory card, for example, and can be removed from the speaker driving device 10D and connected to other devices. Furthermore, the speaker driving device 10D and the storage device 50 may be connected by a fixed line connection or may be wirelessly connected.

The speaker driving device 10D is arranged with an acquisition part 110, a first calculator 130A, a driving signal generator 150A, a setting part 170 and a signal recording part 190. Since the acquisition part 110 and the first calculator 130A have the same structure as explained in the second embodiment, an explanation is omitted. The setting part 170D outputs information to the signal recording part 190 related to a parameter which is changed in the setting change part 177 or a parameter which is already set. In the case when parameters are set using a template, this information may be the name of a template or a value corresponding to each parameter. Here, in particular, information corresponding to the second parameter which is set in the second calculator 153A, that is, information for specifying a driving speaker unit (referred to as driving speaker unit information herein) is output to the signal recording part 190. Furthermore, information corresponding to the first parameter which is set in the first calculator 130A, that is, information for specifying a target speaker unit (referred to as target speaker unit information herein) is output to the signal recording part 190 in addition to the driving speaker unit information.

The signal recording part 190 acquires a user's instruction (recording start, finish and the like) from the operation part 60, acquires the drive signal Sa to be recorded, and encodes data of a predetermined file format (for example, WAVE, MP3, MP4 and the like) and records the data in the storage device 50. At this time, the driving speaker unit information is correlated with the drive signal Sa and recorded. If the drive signal acquired by reading and decoding the data recorded in the storage device 50 is supplied to a speaker unit corresponding to the driving speaker unit information, a sound which is output from the target speaker unit which is set when the drive signal is generated can be reproduced. If the target speaker unit information is correlated, it is possible to confirm what the target speaker unit is.

Furthermore, although a case where the speaker unit 80 is connected to the speaker driving device 10D has been exemplified in the fifth embodiment, as long as it is merely stored in the storage device 50, the speaker unit 80 does not have to be connected. In addition, in the case where the signal recording part 190 is applied to the speaker driving device 10 which does not include the setting part 170 as in the first embodiment, the signal recording part 190 may acquire a parameter already set from the driving signal generator 150.

Sixth Embodiment

In the sixth embodiment, a speaker driving device 10E which is connected to the speaker unit 80 via a network is explained.

Figure 8:
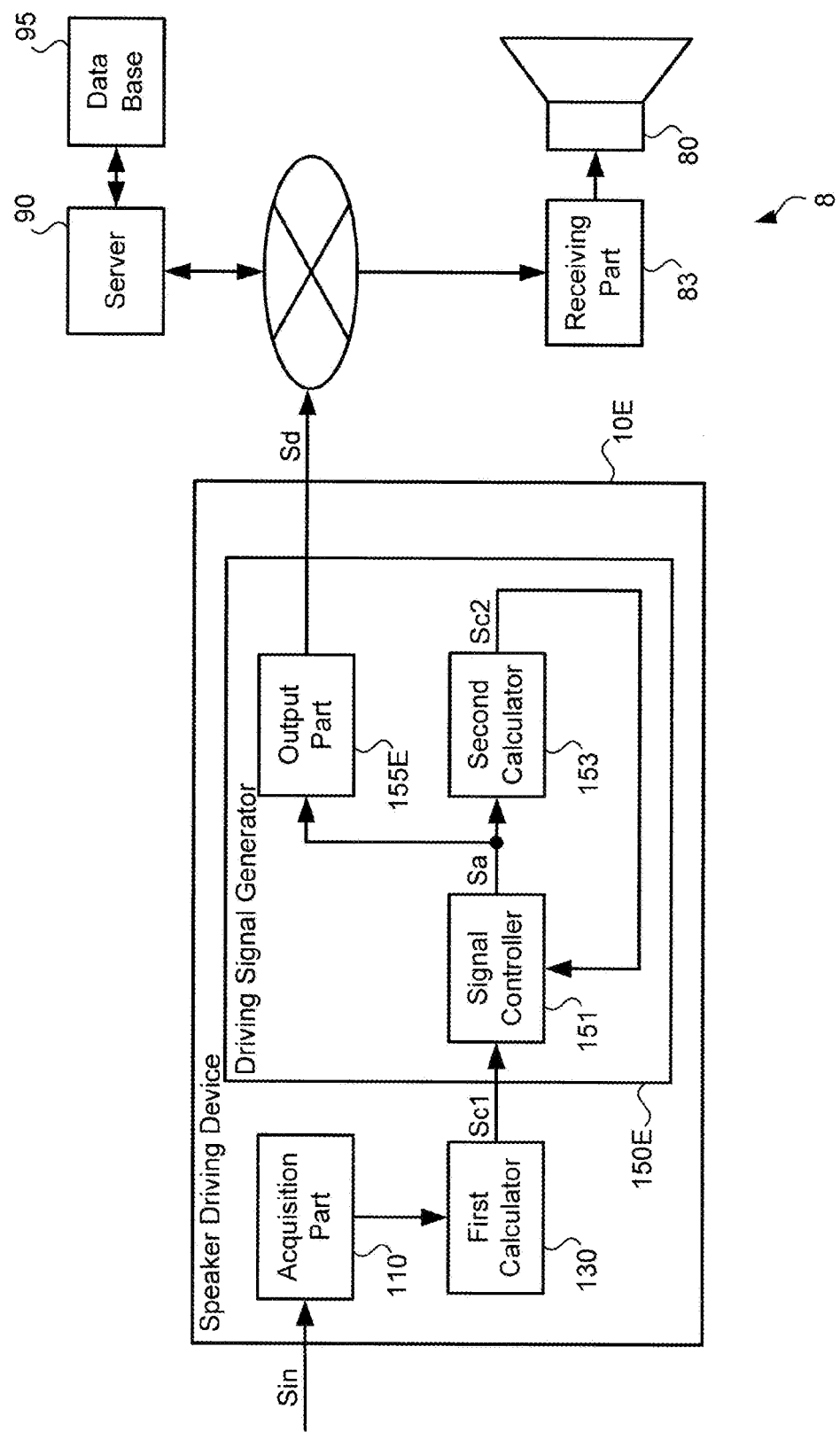
FIG. 8 is a block diagram showing a function of a speaker driving device in a sixth embodiment.

FIG. 8 is a block diagram showing a function of a speaker driving device in the sixth embodiment. The speaker driving device 10E is arranged with an acquisition part 110, a first calculator 130 and a driving signal generator 150E. Since the acquisition part 110 and the first calculator 130 have the same structure as in the first embodiment, an explanation is omitted. The driving signal generator 150E is arranged with a signal controller 151, a second calculator 153 and an output part 155E. Since the signal controller 151 and the second calculator 153 have the same structure as explained in the first embodiment, an explanation is omitted.

The output part 155E encodes the drive signal Sd into data of a predetermined communication standard via a network and transmits the signal to an external device. For example, the network is the Internet or a LAN and the like. The external device is, for example, a speaker device 8 or the server 90. Although the output part 155E transmits the drive signal Sd in a streaming format, it may also transmit data encoded in a predetermined file format as shown in the fifth embodiment.

The speaker device 8 is arranged with a receiving part 83 and a speaker unit 80. The receiving part 83 receives and decodes the drive signal Sd transmitted from the speaker driving device 10E and supplies the drive signal Sd to the speaker unit 80.

When the server 90 receives the drive signal Sd transmitted from the speaker driving device 10E, the server 90 registers the drive signal Sd in a database 95. At this time, as is shown in the fifth embodiment, at least one of the driving speaker unit information and the target speaker unit information may be correlated with the drive signal Sd and registered in the database 95.

Seventh Embodiment

In the seventh embodiment, an example in which the speaker device in the embodiments described above is realized using software with a computer is explained. In this example, an example in which the speaker device 1A in the second embodiment is applied to a tablet type computer 1000 is explained.

Figure 9:
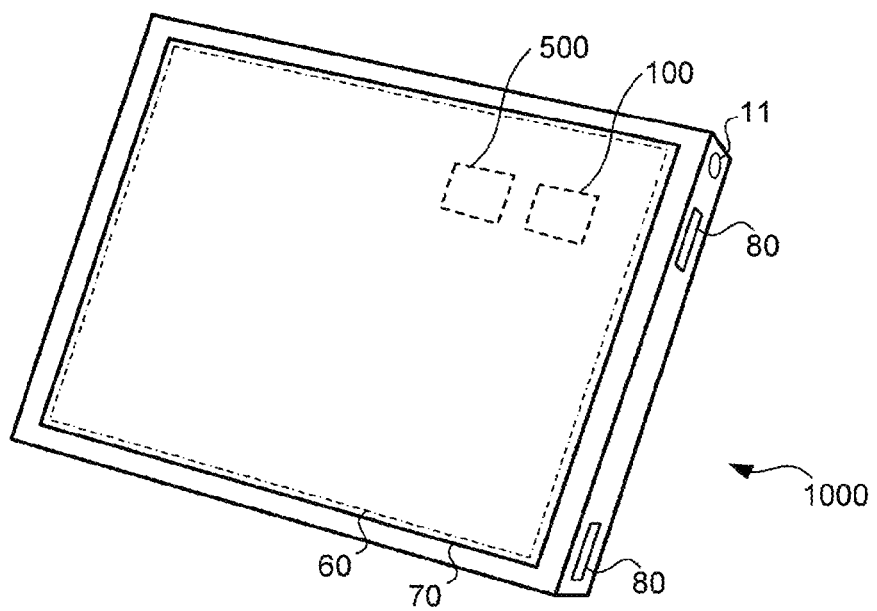
FIG. 9 is an exterior appearance diagram showing a tablet type computer in a seventh embodiment.

FIG. 9 is an external appearance diagram showing a tablet type computer in the seventh embodiment. The tablet type computer 1000 is arranged with an input/output terminal 11, an operation part 60, a display part 70 and a speaker unit 80. In addition, the tablet type computer 1000 is also arranged with a controller 100 and a storage part 500. The controller 100 includes a calculation processing circuit such as a CPU, executes a program stored in the storage part 500, and realizes each function of the speaker driving device 10A shown in FIG. 2 on software. That is, this program makes the tablet type computer 1000 function as the speaker driving device 10A. Furthermore, this program may be installed in the tablet type computer 1000 in advance or may be acquired from an external memory or downloaded via a network.

The acquisition part 110 may acquire the audio signal Sin from the input/output terminal 11 or may acquire the audio signal Sin which is generated in the controller 100. In addition, in the case when headphones are connected to the input/output terminal 11, the output part 155 may output the drive signal Sd to the input/output terminal 11 instead of the speaker unit 80. At this time, the second parameter which is set in the second calculator 153A may be automatically changed. The changed second parameter may be set to a value which corresponds to the headphones. At this time, it is not necessary that the second parameter have a value which corresponds to the headphones which are connected to the input/output terminal 11. Although the input/output terminal 11 shares an input terminal and an output terminal in this example, they may also be separately arranged. Furthermore, as is described in the fourth embodiment, as long as a structure is adopted in which identification information can be acquired from the headphones, the second parameter may be changed based on this identification information.

Here, although an example was explained in which each function of the speaker driving device is realized on software, it may also be realized by a DSP or the like.

Example of First Parameter and Second Parameter

As is described above, the first parameter and the second parameter are at least one parameter (also sometimes called a TS parameter) which stipulates an equivalent circuit of a speaker unit. A specific example (Lumped Parameter Model) of a parameter which stipulates an equivalent circuit of a speaker unit is explained.

[Single Speaker Unit]

Figure 10:
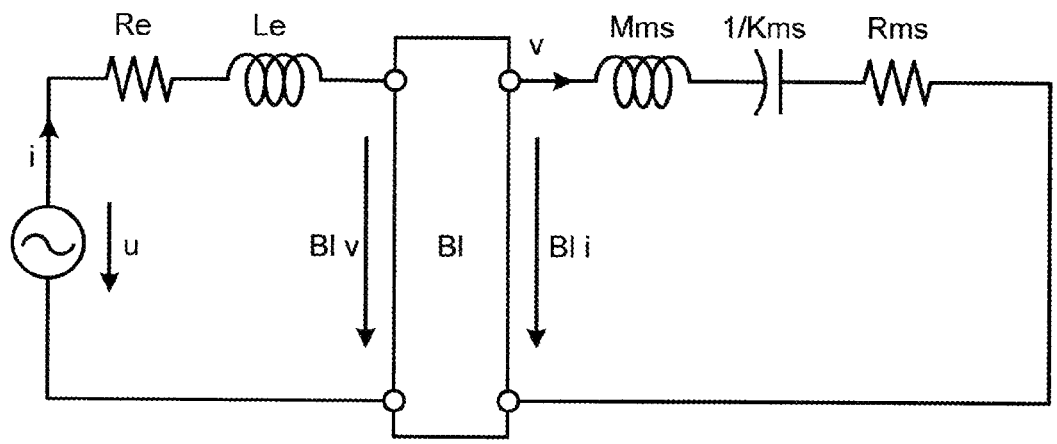
FIG. 10 is a diagram for explaining a specific example of a parameter which stipulates an equivalent circuit (Lumped Parameter Model) of a speaker unit.

FIG. 10 is a diagram for explaining a specific example of a parameter which stipulates an equivalent circuit (Lumped Parameter Model) of a speaker unit. The contents of each parameter shown in FIG. 10 are also shown in FIG. 10. Here, an example of a characteristic change of a speaker unit when the values of these parameters are changed is explained. For example, it is possible to change the frequency response of a target speaker unit by changing the value of the parameter set in the first calculator 130.

FIG. 11 is a diagram showing a change in frequency response and step response in the case when Rms (mechanical resistance) is changed. In FIG. 11, a change in the frequency response and the step response is shown when the Rms value is 0.2 times a predetermined reference value and when it is 5 times the reference value. When the Rms (mechanical resistance) is changed, it is possible to change at least the frequency response (in particular the strength of the resonance frequency) and the step response. As is shown in FIG. 11, for example, when the Rms is increased, it is possible to suppress the intensity at the resonance frequency (amplitude of the diaphragm) and it is possible to reduce the time for suppressing a fluctuation of the intensity with almost no change in the rise of the vibration (rise of the sound).

FIG. 12 is a diagram showing a change in a frequency response and step response in the case when Kms (stiffness) is changed. FIG. 13 is a diagram showing a change in a frequency response and step response in the case when Mms (mass) is changed. In FIG. 12, a change in the frequency response and the step response when the value of Kms is 0.5 times a predetermined reference value and 2 times the reference value is shown. In FIG. 13, a change in the frequency response and the step response when the value of Mms is 0.5 times a predetermined reference value and 2 times the reference value is shown. As is shown in FIG. 12 and FIG. 13, it is possible to change a resonance frequency when Kms (stiffness) or Mms (mass) is changed. For example, when Kms is reduced or Mms is made heavier, it is possible to reduce the resonance frequency. In a speaker unit, a lower limit frequency is determined by the resonance frequency in relation with radiation impedance.

Generally, the thickness and the weight of a diaphragm are adjusted in order to change characteristics such as the frequency response of a speaker unit as described above. However, in this type of adjustment, various parameters are changed together, and it becomes necessary to change a very complicated design in order to obtain the desired characteristics. For example, in order to suppress the effects of divided vibrations in the mid to high range, it is preferred that the diaphragm is thick and has a high rigidity ratio, and moreover the material is light and has a large internal loss and a small diameter. In addition, in the low range, it is more effective if the aperture is large and the distortionless amplitude is large. Furthermore, it is necessary to consider the difficulty of processing and durability, and it is generally difficult to satisfy these at the same time. On the other hand, for example, by changing the value of a parameter of an equivalent circuit of a target speaker unit which is set in the first calculator 130, it is possible to partially control parameters independently from other parameters, and It is possible to change mechanical resistance without changing the weight of the diaphragm. Therefore, it is possible to easily realize characteristics which are physically difficult to realize such as light and good transient characteristics, large mechanical resistance without unnecessary vibration occurring and easy output of low sound with low stiffness while using a thick diaphragm in order to reduce the effects of divided vibration, and which can also be adjusted later by signal processing.

[Closed Type Enclosure Arranged Speaker Unit]

FIG. 14 is a diagram for explaining a specific example of a parameter which stipulates an equivalent circuit of a speaker unit arranged in a closed type enclosure (Closed Box). The contents of each parameter shown in FIG. 14 are also shown in FIG. 14. Furthermore, the parameters shown in FIG. 10 are omitted from this diagram. Here, the effects of Ka (stiffness) according to the capacity of the enclosure are added. Furthermore, as is shown in FIG. 14, it is also possible to calculate this parameter from parameters related to the shape of the enclosure such as Sd and Cb. Therefore, Ka is not directly set but may be indirectly set by setting the capacity (Cb) of the enclosure. That is, the parameters which stipulate the equivalent circuit are not limited to a case where they are directly set but may also be indirectly set via parameters which are required for acquiring this parameter. Therefore, it is possible to set parameters assuming enclosures of various sizes without actually manufacturing an enclosure.

[Bass-Ref (Bass Reflex) Type Enclosure Arranged Speaker Unit]

Figure 15:
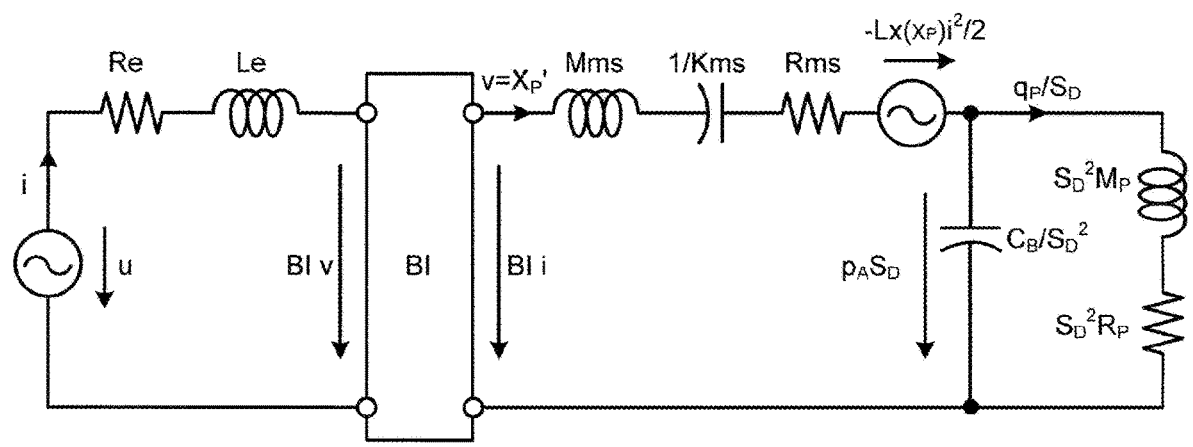
FIG. 15 is a diagram for explaining a specific example of a parameter which stipulates an equivalent circuit of a speaker unit arranged in a bass-reflex type enclosure (Vented Box).

FIG. 15 is a diagram for explaining a specific example of parameters which stipulate an equivalent circuit of a speaker unit arranged in a bass-reflex type enclosure (Vented Box). The contents of each parameter shown in FIG. 15 are also shown in FIG. 15. Furthermore, the parameters shown in FIG. 10 are omitted from this diagram. In this example, the characteristics of a duct section are added. This type of equivalent circuit is exemplified in the following documents. Wolfgang Klippel, "Direct Feedback Linearization of Nonlinear Loudspeaker Systems", JAES Volume 46 Issue 6 pp. 499-507; June 1998

Generally, it is difficult for a bass-reflex type enclosure to realize acoustic characteristics according to a design. On the other hand, in this example, even if an enclosure in which the shape of the duct section is actually changed is not mass produced, it is possible to change the value of the parameter shown in FIG. 15 assuming a bass-reflex type enclosure having desired characteristics.

As is described above, various parameters which stipulate an equivalent circuit of a speaker unit can be acquired according to the calculation model in the first calculator 130 and the second calculator 153. All of these parameters may be changed or only some of them may be changed and the rest may have a predetermined value.

Furthermore, as a conventional technique, there is also a method for realizing a characteristic such as a frequency response of a predetermined speaker unit using an impulse response or a transfer function and the like. However, in the case when such a calculation method is used, it is necessary to prepare a separate impulse response or transfer function each time in order to change the frequency response of the speaker unit. On the other hand, similar to the first calculator 130, by changing the value of a parameter which stipulates an equivalent circuit of a speaker unit, it is possible to easily change the frequency response of a speaker unit.

By changing the parameters which are set in the first calculator 130, it is possible to easily change the characteristics of a target speaker unit. On the other hand, it is easy to change the value of the parameter which is set in the second calculator 153 when a connected driving speaker unit is changed. In addition, although the driving speaker unit was described above as a single unit, in the case of having a plurality of channels such as stereo 2ch and the like, it is possible to change the value of the parameter set in the second calculator 153 according to the driving speaker unit corresponding to each respective channel. For example, even if the same driving speaker unit is used for a plurality of channels, mutual driving speaker units may include different characteristics due to variations in manufacturing and may include differences depending on the environment (periphery structure and the like) in which the speaker units are arranged. In this type of case, a parameter set in the second calculator 153 may be made different for each channel according to each situation.

Modified Example

Although one embodiment of the present invention was explained above, each embodiment described above can be applied by being combined with each other or replaced. In addition, each of the embodiments described above can be modified and implemented as follows.

(1) Each function of the speaker driving device in each embodiment may be realized by an analog circuit or may be realized by a digital circuit.

(2) The speaker driving devices described above may be realized in a server which is connected to a network. In this case, the speaker driving device may receive the audio signal Sin via the network and transmit the drive signal Sa or the drive signal Sd via the network. This structure can also be said to be a server including the function of the speaker driving device 10E explained in the sixth embodiment (FIG. 8).

(3) The audio signal Sin may include a plurality of channels. In the case when one speaker unit is used in one channel, a plurality of speaker driving devices may be used according to the number of channels.

(4) In a digital speaker device, there are cases in which one speaker unit is driven by a plurality of voice coils or a plurality of speaker units are driven. In the case where one speaker unit is driven by a plurality of voice coils, a plurality of drive signals Sd are used for one speaker unit. In this case, the drive signal Sa which is generated by the signal controller may include a plurality of channels. The second calculator may acquire the position of a diaphragm corresponding to the driving speaker unit using the drive signal Sa of a plurality of channels. In addition, the speaker unit 80 may be driven by the drive signal Sd of a plurality of channels.

On the other hand, in the case where a plurality of speaker units are used, it is sufficient that the first calculation signal Sc1, the second calculation signal Sc2 and the drive signal Sa of the number of channels corresponding to each speaker unit are generated. In this case, a plurality of target speaker units is necessary, and the first calculator acquires the position of the diaphragm in the plurality of target speaker units based on the audio signal Sin.

As is described above, a known technology can be used for a digital speaker device which drives one speaker unit with a plurality of voice coils, or a digital speaker device that drives a plurality of speaker units. As a known technology, for example, it is possible to use the technology disclosed in U.S. Pat. No. 8,423,165 Specification, U.S. Pat. No. 8,306,244 Specification, U.S. Pat. No. 9,219,960 Specification, and U.S. Pat. No. 9,300,310 Specification. According to this technology, a noise shaper which uses a $\Delta\Sigma$ modulator and a mismatch shaper which selects a voice coil for distributing a drive signal so as to reduce variations are used.

(5) The driving signal generator 150 does not need to include the second calculator 153. In this case, the signal controller 151 may perform a process for converting the first calculation signal Sc1 which indicates the position of a diaphragm to the drive signal Sa. This conversion process may be performed using a known technology (for example, a model calculation using radiation characteristics and spatial propagation) or simply a process for conversion to a velocity.

(6) Although the object of the electromechanical model and the object which is driven based on an electric signal (drive signal) in the first calculator and the second calculator are speaker units in the embodiments described above, any object may be used as long as it is an object which converts an electric signal into an action such as the position or speed of a machine and can be described by a differential equation. For example, electromechanical converters such as motors, piezoelectric elements, magnetostrictive elements and electrostatic actuators and the like which are objects which can be described by differential equations can be applied to the present invention. Therefore, a speaker driving device can be said to be an example of a driving device of an electromechanical converter. Furthermore, electromechanical converters such as those described above may also be included in a structure in which the diaphragm of a speaker unit is displaced.

What is claimed is:

1. A speaker drive device comprising:
   a first calculator configured to calculate information related to a position of a diaphragm of a first speaker unit by a first electromechanical model calculation using a first parameter defining an equivalent circuit of the first speaker unit and an input signal, and outputting a first calculation signal corresponding to the calculated information; and
   a driving signal generator configured to generate a drive signal for driving an output speaker unit,
   wherein
   the driving signal generator includes a second calculator,
   the second calculator calculates information related to a position of a diaphragm of a second speaker unit by a second electromechanical model calculation using a second parameter defining an equivalent circuit of the second speaker unit and the drive signal before supplying the drive signal to the output speaker unit and outputting a second calculation signal corresponding to the calculated information,
   the driving signal generator generates the drive signal based on the first calculation signal and the second calculation signal,
   the speaker drive device further comprises a user interface provider configured to provide a first interface for specifying the second parameter set in the second calculator, and
   the user interface provider is configured to provide a second interface for specifying correction information for correcting a process in the second calculator, and the second calculator corrects the second parameter based on the correction information.

2. The speaker drive device according to claim 1, further comprising:
   a signal recording part configured to correlate and record information for specifying the second speaker unit with the drive signal in a recording device.

3. The speaker drive device according to claim 2, wherein the signal recording part correlates and records information for specifying the first speaker unit with the drive signal in the recording device.

4. The speaker drive device according to claim 1, wherein the first electromechanical model calculation is the same as the second electromechanical model calculation.

5. The speaker drive device according to claim 1, wherein the user interface provider is configured to provide a third interface for specifying the first parameter set in the first calculator.

6. The speaker drive device according to claim 1, further comprising:
   a specifying part configured to acquire information related to the second speaker unit from a memory to specify the second parameter based on the information, the output speaker unit being arranged with the memory.

7. The speaker drive device according to claim 1, wherein the drive signal generator includes an output part, the output part performs adjustment of a dynamic range of the drive signal to be generated to output the drive signal to the output speaker unit.

8. The speaker drive device according to claim 1, further comprising:
   an output part configured to transmit the drive signal via a network.

* * * * *